United States Patent [19]

Takahasi et al.

[11] Patent Number: 5,124,763
[45] Date of Patent: Jun. 23, 1992

[54] INSULATED-GATE TYPE INTEGRATED CIRCUIT

[75] Inventors: Tsutomu Takahasi; Takeshi Suyama, both of Kawasaki; Satoshi Suzuki, Yokohama; Isao Abe, Kawasaki; Akihiro Sueda, Yokohama, all of Japan

[73] Assignee: Kabushiki Kaisha Toshiba, Kawasaki, Japan

[21] Appl. No.: 651,435

[22] Filed: Feb. 7, 1991

[30] Foreign Application Priority Data

Feb. 8, 1990 [JP] Japan ................................. 2-29249

[51] Int. Cl.$^5$ ...................... H01L 29/10; H01L 29/78
[52] U.S. Cl. .................. 357/23.4; 357/23.8; 357/42; 357/53; 357/55
[58] Field of Search ............... 357/23.4, 68, 23.8, 357/42, 53, 55

[56] References Cited

U.S. PATENT DOCUMENTS 4,937,645  6/1990  Ootsuka et al. ............... 357/23.9

Primary Examiner—Edward J. Wojciechowicz
Attorney, Agent, or Firm—Finnegan, Henderson, Farabow, Garrett and Dunner

[57] ABSTRACT

A P-well region is provided in a semiconductor substrate of N-type. A P-channel MOSFET is arranged in the N-type substrate while an N-channel MOSFET is arranged in the P-well region. The drain regions of the respective MOSFETs consist of high concentration impurity diffused regions and low concentration impurity diffused regions arranged about the respective high concentration impurity diffused regions. Also, a drain electrode is provided to cover the entire of the high and low concentration impurity diffused regions.

14 Claims, 8 Drawing Sheets

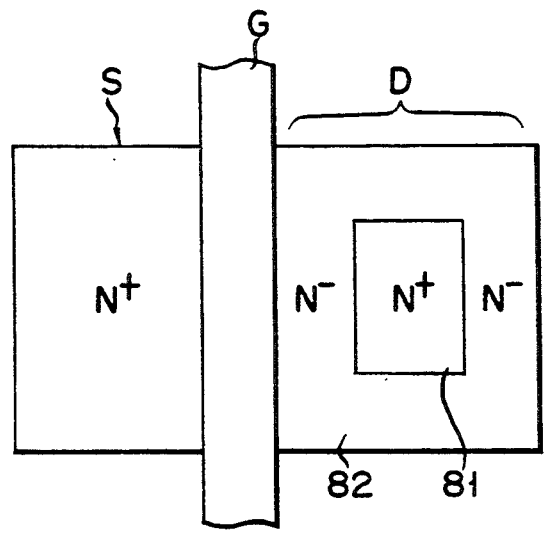
F I G. 8
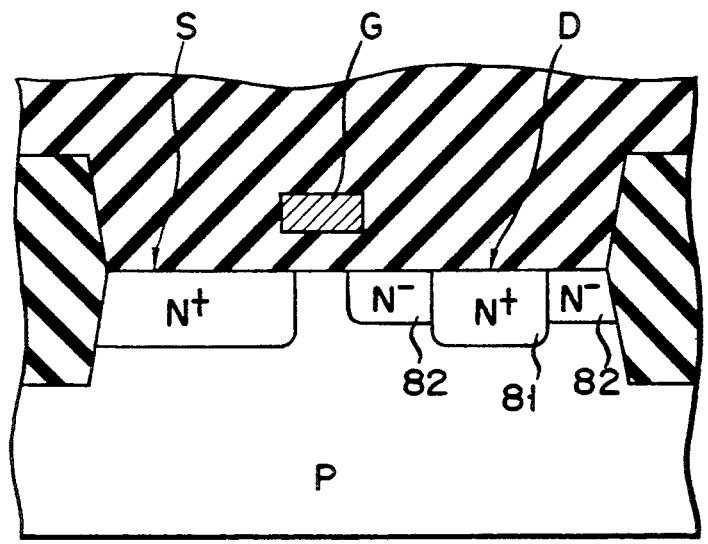
F I G. 9

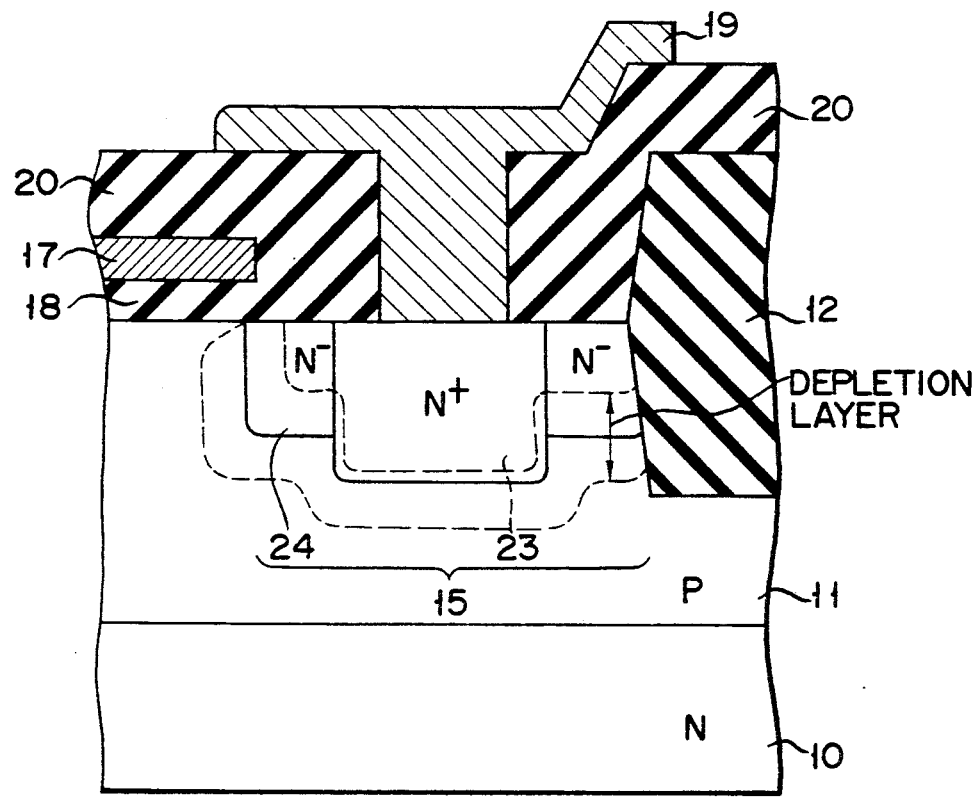
F I G. 12
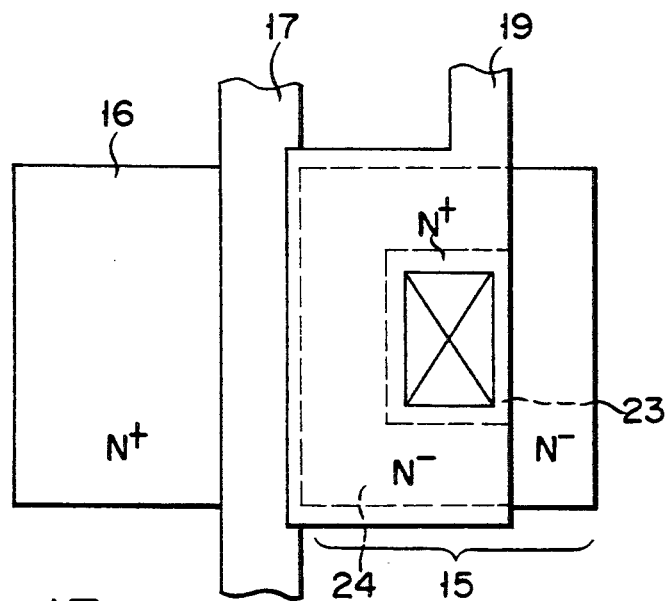
F I G. 13

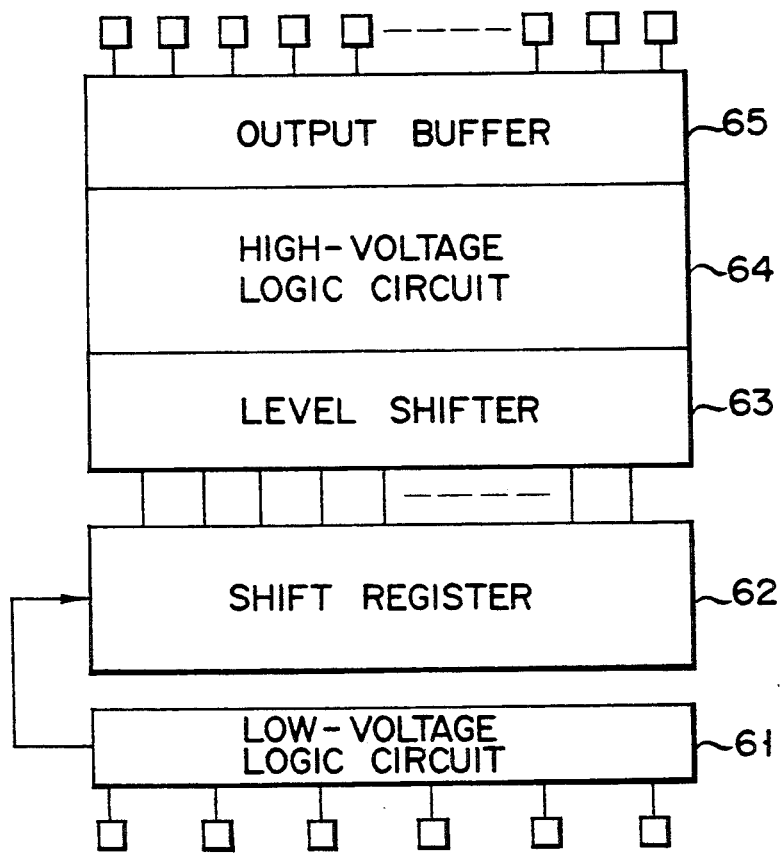
F I G. 16

INSULATED-GATE TYPE INTEGRATED CIRCUIT

BACKGROUND OF THE INVENTION

1. Field of the Invention

The present invention relates to an insulated-gate type integrated circuit and more particularly, a MOS type integrated circuit having a MOSFET which is operable with a higher supply voltage than 5 volts or required for production of a high voltage output.

2. Description of the Related Art

It is known that the structure of a MOSFET operable with a high supply voltage or required for generation of a high voltage output for use in a semiconductor integrated circuit commonly incorporates an LDD (lightly doped drain) arrangement or a GDD (graded diffused drain) arrangement.

FIG. 1 is a plan view showing the drain pattern of a conventional CMOS inverter in which a couple of MOSFETs having the LDD arrangement are provided in the N- and P-channel sides, respectively. FIG. 2 is a cross sectional view taken along the line I—I of FIG. 1, illustrating the element arrangement of the CMOS inverter.

In FIGS. 1 and 2, there are denoted by reference numerals an N-type semiconductor substrate 110, a P-well region 111, an element separation region 112, source and drain regions 113 and 114 of a P-channel MOSFET, source and drain regions 115 and 116 of an N-channel MOSFET, a gate electrode 117 (with lead line) arranged in an insulated gate layer 118 above the substrate or well region surface, and an aluminum lead line 119 arranged on an insulating layer 120 across the substrate 110.

Each of the drain regions 114 and 115 of the P- and N-channel MOSFETs is consisted of, in combination, a low concentration impurity diffused region (P- or N- region) and a high concentration impurity diffused region (P+ or N+).

When a lower potential is applied to the gate electrode 117, the N-channel MOSFET becomes turned OFF and the P-channel MOSFET becomes turned ON. Also, it is assumed that a supply voltage of a higher potential is fed to both the source region 113 of the P-channel MOSFET and the N-type substrate 110 and of a lower potential is fed to both the source region 116 of the N-channel MOSFET and the P-well region 111.

Then, as shown in FIG. 2, the aluminum lead line 119 on the drain diffused region is maintained at a high potential (which is denoted by ⊕) and equals the potential of the drain regions 114 and 115.

Accordingly, there are two PN junctions which exhibit a reverse bias state. One of the two PN junctions is between the P-well region 111 and the N-type substrate 110. In general, both the P-well region 111 and the N-type substrate 110 contain a low concentration of impurities and thus, a junction sustaining voltage between them will be as high as 70 to 100 volts.

The other PN junction between the P-well region 111 and the drain region 115 (including N+ and N- regions) of the N-channel MOSFET is associated with some drawbacks and then, illustrated in enlargement in FIG. 3

This will be described with reference to three separate areas of the PN junction: (1) between the P-well region 111 and the lowermost area of the N+ region, (2) between the P-well region 111 and a gate electrode side portion of the N-region, and (3) between the P-well region 111 and a far side portion (at a far side from the gate electrode 117) of the N-region.

The PN junction area 1) has a depletion layer developed into the low concentrated P-well region 111 and exhibits a sustaining voltage of 50 to 70 volts. The depletion layer of the PN junction area (2) is dislocated towards the N-region by the action of the electric field of the gate electrode 117 whereby electric energy will be biased in intensity. However, adjustment on the concentration of impurities in the N- region causes the depletion layer to expand toward the inside of the N-region so that an unwanted concentration of energy can be avoided. As the result, the sustaining voltage will be 40 to 50 volts. The depletion layer of the PN junction area (3) is developed due to lesser effects of the electric field of the gate electrode 117 and the sustaining voltage of the same will remain higher than that of the area 2).

As set forth above, the sustaining voltage of the drain junctions in an N-channel MOSFET can be maintained to the level of the prior art when the potential of the aluminum lead line 119 provided above the drain regions is high.

When the potential of the aluminum lead line 119 is low (equal to the low potential of the gate electrode 117, denoted by ⊖), the sustaining voltage between the P-well region and the N-type substrate exhibits 70 to 110 volts.

FIG. 4 is an enlarged view showing the PN junction between the P-well region 111 and the drain region (including N+ and N-regions) in the N-channel MOSFET. Similarly, while the PN junction is separated into three areas for ease of description, the area 1) between the P-well region 111 and the lowermost of the N+ region exhibits a sustaining voltage of 50 to 70 volts. However, at the area 2) between the P-well region 111 and the N- region adjacent to the gate electrode 117, the sustaining voltage i attenuated by the electric field of the aluminum lead line 119. More specifically, holes or minority carriers in the N- region are attracted towards the surface of the semiconductor substrate by the electric field of the aluminum lead line 119 which is disposed above the low concentration impurity diffused region (N- region) of the drain in the N-channel MOSFET. As a result, the surface density of carriers in the N- region is varied, causing, at a particular initial concentration rate, the surface area of the N- region to be inverted into a P-type of semiconductor by the action of the electric field of the aluminum lead line 119. The inverted P-type region is then approximated to the high concentration impurity diffused region (N+ region) so that electric field lines can be converged at the substrate surface. Accordingly the sustaining voltage at the PN junction will be decreased. This phenomenon is emphasized when the low concentration impurity diffused region of the drain is decreased in the impurity concentration for the purpose of increasing the drain junction sustaining voltage. Also, at the junction area 3) between the P-well region 111 and the far N- region from the gate electrode 117, the concentration of carriers at the surface of the N- region is varied by the electric field of the aluminum lead line 119 arranged above the N-region. But, unlike the PN junction area 2), the junction area 3) is rarely affected by the electric field of the gate electrode 117 and its sustaining voltage will be less attenuated than that of the area 2).

FIG. 5 is a characteristic diagram showing the change of the sustaining voltage of the drain junction in relation to the potential of the aluminum lead line 119 arranged above the drain region. When the aluminum lead line 119 is identical to the potential of high level to the drain region and a difference in the supply voltage between the higher and lower levels is more than 48 volts, the supply current will sharply increase. Also, when the aluminum lead line 119 is low in potential as well as the gate electrode 117, the supply current will sharply be increased by more than 43 volts of the supply voltage difference between the higher and lower levels. As apparent from the characteristic diagram of FIG. 5, the junction sustaining voltage will drop about 10% from 48V to 43V corresponding to a decrease in the potential of the aluminum lead line 119.

The change of the junction sustaining voltage with the potential of the aluminum lead line 119 disposed above the drain area indicates that a plurality of different drain sustaining voltages exist in the same channel MOSFET depending on the peripheral conditions. In other words, the sustaining voltage or leak current is varied by the content of a signal and the assessment of the sustaining voltage in an integrated circuit will be troublesome.

SUMMARY OF THE INVENTION

It is thus an object of the present invention to provide an insulated-gate type integrated circuit in which the drain junction sustaining voltage in a MOSFET does not depend on the pattern arrangement of aluminum lead lines disposed above the low concentration impurity diffused region and remains constant, thus allowing the operating voltage of the MOSFET to be maintained at a high level and ensuring ease of the assessment of the sustaining voltage in the circuit.

An insulated-gate type integrated circuit according to the present invention comprises a gate electrode, a drain region having a low concentration impurity diffused region thereof arranged adjacent to the gate electrode, and a high concentration impurity diffused region thereof arranged next to the low concentration impurity diffused region, and a conductor layer provided above and electrically coupled to the drain region to cover the entire surface of the low concentration impurity diffused region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

FIG. 8 is a plan view showing the pattern of another N-channel MOSFET incorporating the LDD arrangement;

FIG. 9 is a cross sectional view of the MOSFET of FIG. 8;

FIG. 12 is a partially enlarged cross sectional view of the arrangement of FIG. 11;

FIG. 13 is a plan view of the primary pattern of an integrated circuit according to a second embodiment of the present invention;

FIG. 16 is a block diagram of the integrated circuit of the present invention employed for actuation of liquid crystal display.

DETAILED DESCRIPTION OF THE PREFERRED EMBODIMENTS

Figure 1:
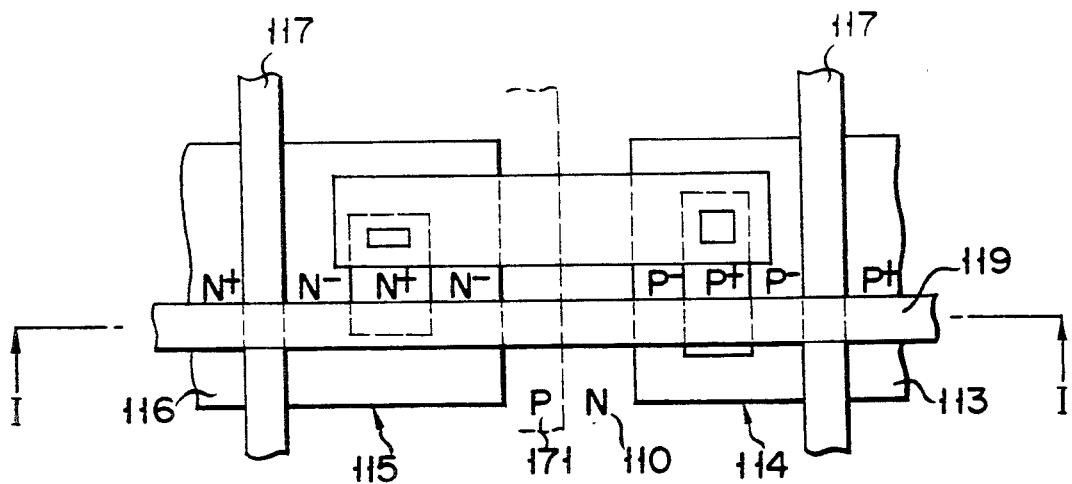
FIG. 1 is a plan view showing the primary pattern of a prior art CMOS inverter.
Figure 2:
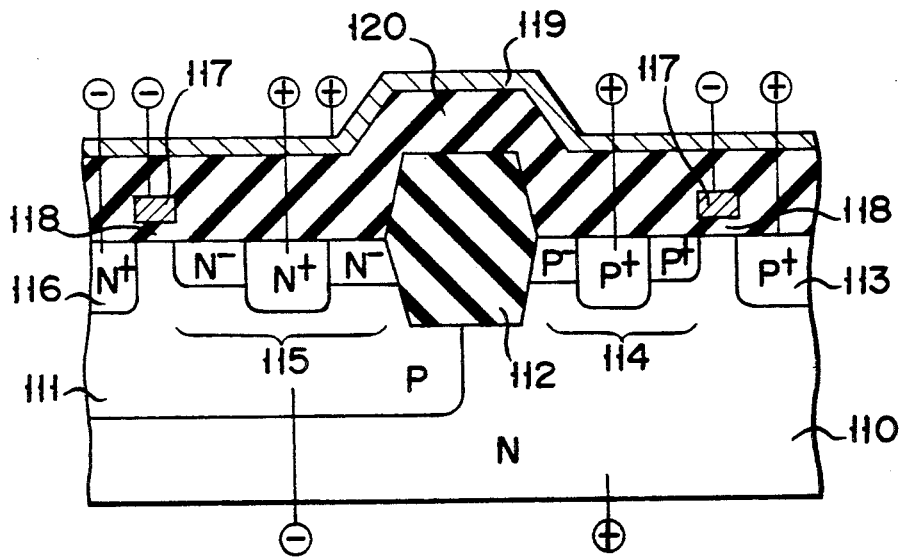
FIG. 2 is a cross sectional view taken along the line I—I of FIG. 1, showing the element arrangement.
Figure 3:
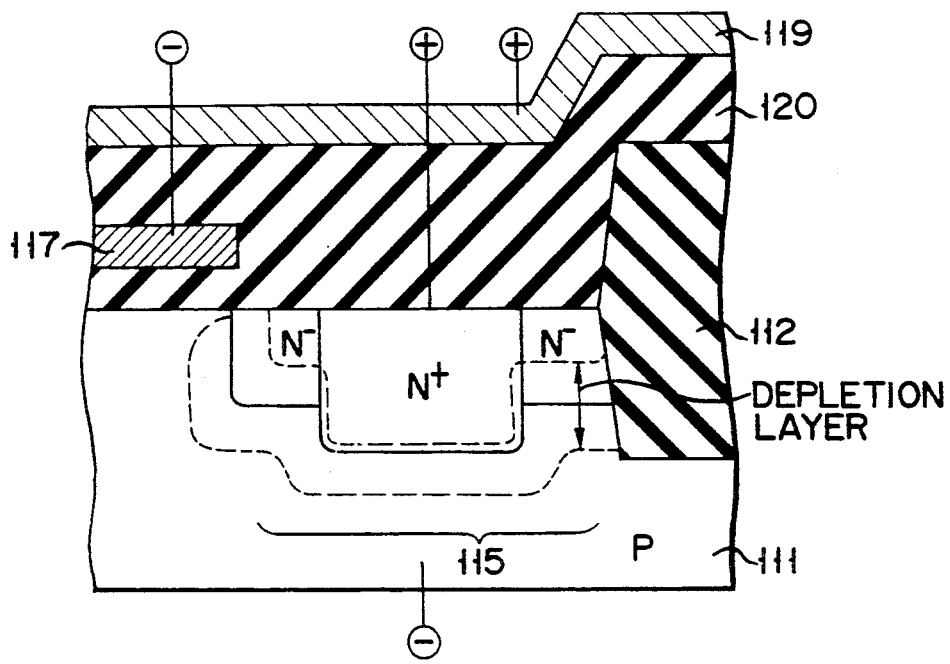
FIG. 3 is a partially enlarged cross sectional view of the arrangement of FIG. 2.
Figure 4:
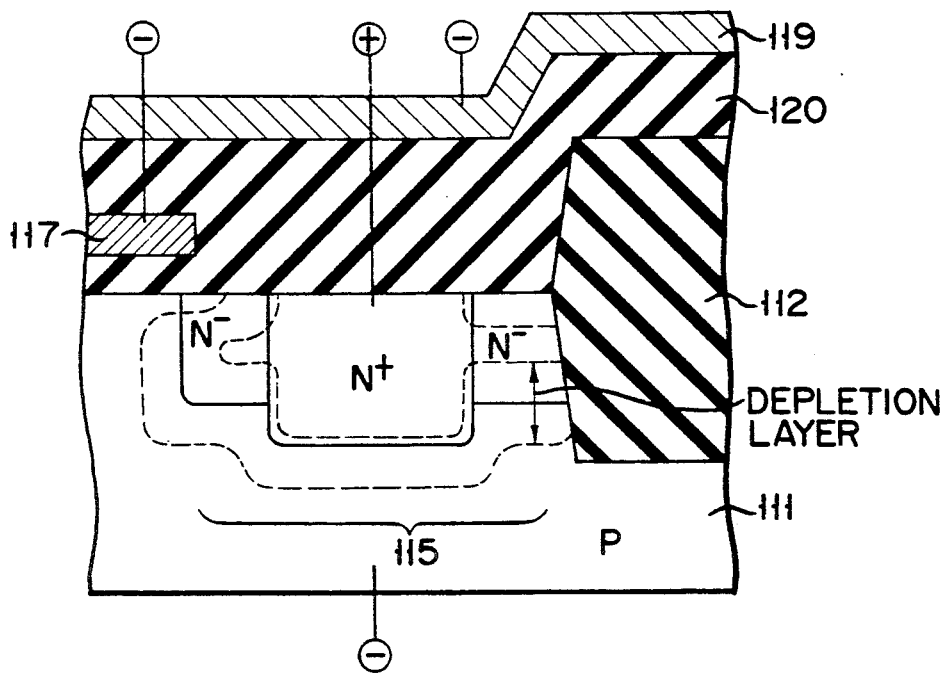
FIG. 4 is a partially enlarged cross sectional view similar to FIG. 3.
Figure 5:
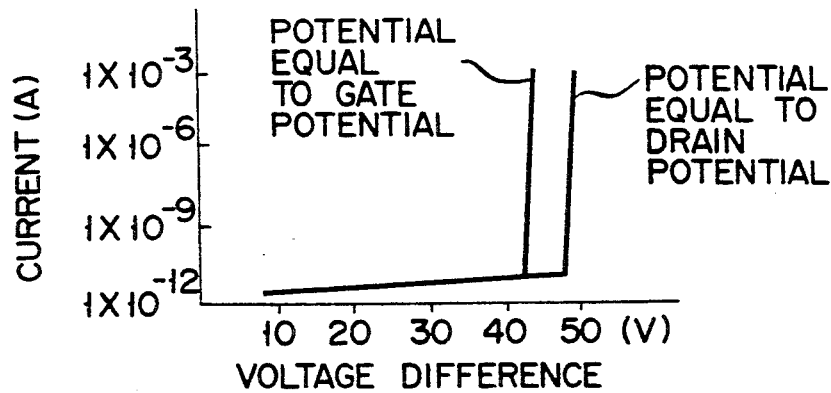
FIG. 5 is a characteristic diagram showing the variation of a supply current in the CMOS inverter of FIG. 1.
Figure 6:
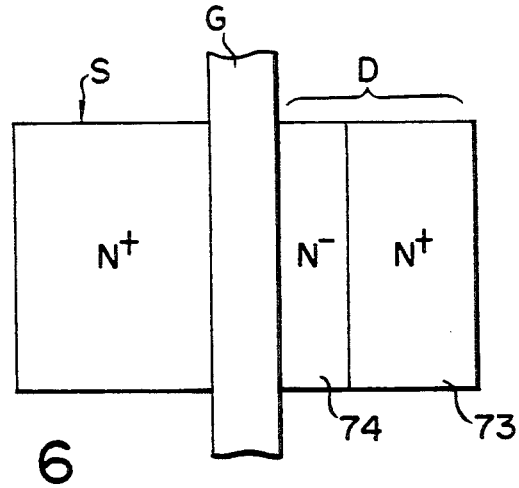
FIG. 6 is a plan view showing the pattern of an N-channel MOSFET incorporating the LDD arrangement.
Figure 7:
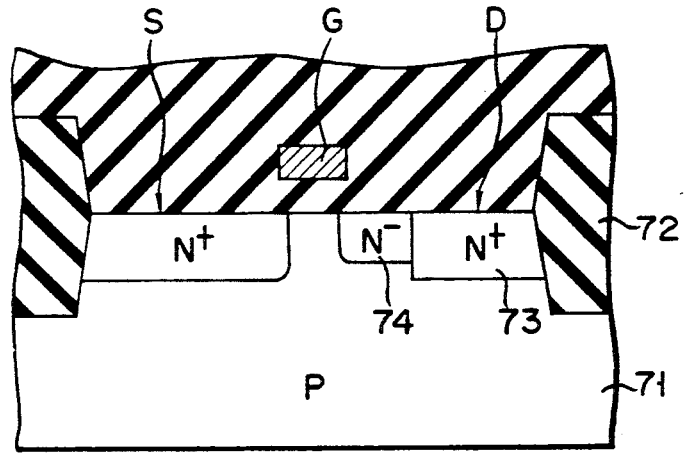
FIG. 7 is a cross sectional view of the MOSFET of FIG. 6.

FIG. 6 is a plan view showing the pattern of an N-channel MOSFET incorporating the LDD arrangement and FIG. 7 is a cross sectional view of the same. As shown, there are denoted a P-type semiconductor substrate 71, an element separation region 72, a drain region D, a source region S, and a gate electrode separated by an insulated-gate layer (and its lead line) from the channel region on the substrate surface.

The LDD arrangement is intended for attenuating the effect of the electric field on the drain region adjacent to the gate electrode in the MOSFET, in which a low concentration impurity diffused region 74 (N- region) of the drain region is provided at the gate electrode side and next to a high concentration impurity diffused region 73 (N+ region).

FIG. 8 is a plan view showing the pattern of another N-channel MOSFET incorporating the LDD arrangement and FIG. 9 is a cross sectional view of the same. As shown, an N- region 82 is arranged about an N+ region 81 in the drain region of the MOSFET other than adjacent to the gate electrode.

Figure 10:
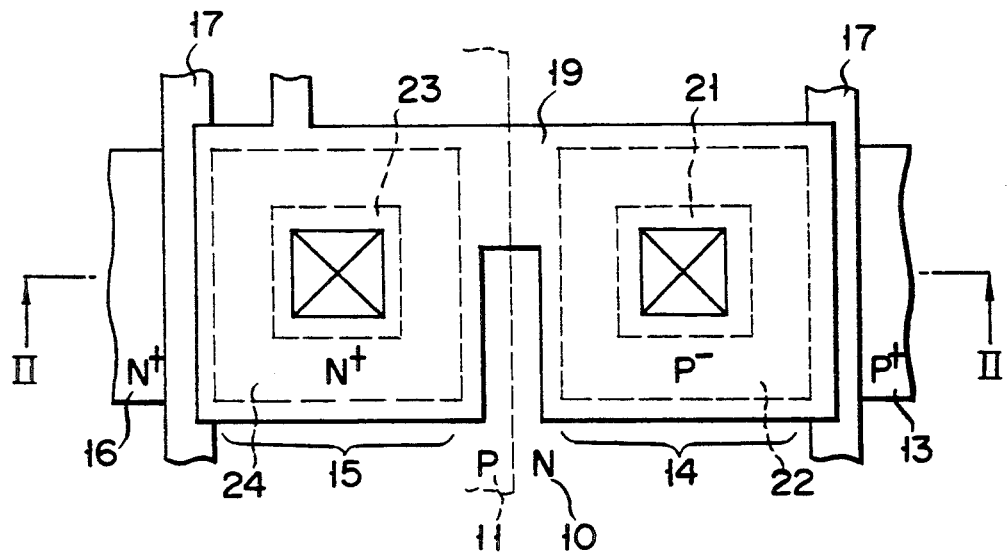
FIG. 10 is a plan view of the primary pattern of an integrated circuit according to a first embodiment of the present invention.
Figure 11:
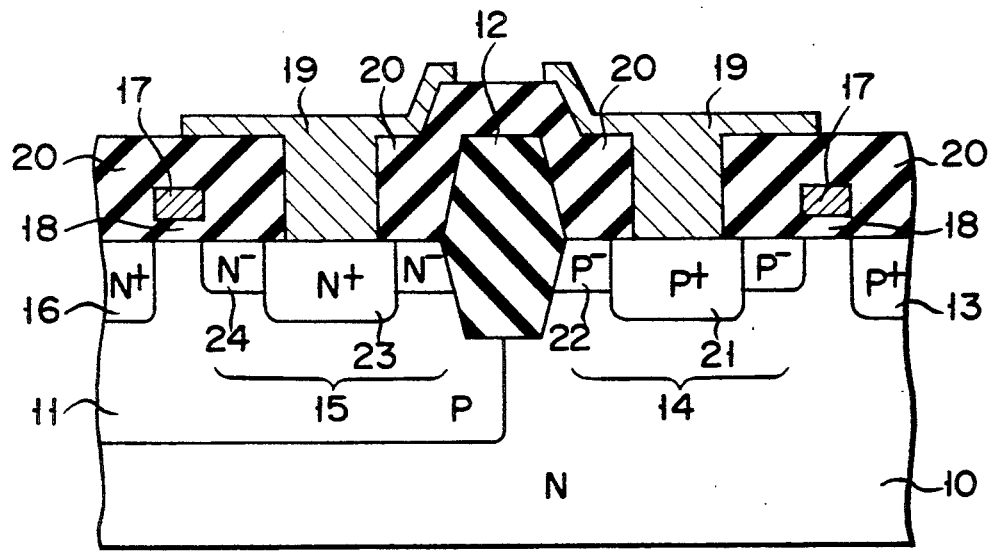
FIG. 11 is a cross sectional view taken along the line II—II of FIG. 10, showing the element arrangement.

FIG. 10 is a plan view of the pattern of an insulated-gate type integrated circuit showing a first embodiment of the present invention. FIG. 11 is a cross sectional view taken along the line II—II of FIG. 10, illustrating the element arrangement. The integrated circuit of the first embodiment is a CMOS integrated circuit having P- and N-channel MOSFETs in which the operating voltage is higher than a common operating voltage, e.g. 5V, or the output of a higher voltage if desired. Each of the P- and N-channel MOSFETs incorporates the same LDD arrangement as shown in FIG. 8.

There are shown an N-type semiconductor substrate 10, a P-well region 11, an element separation region 12, source and drain regions 13 and 14 in the P-channel MOSFET, drain and source regions 15 and 16 in the N-channel MOSFET, and a gate electrode 17 (with its lead line) arranged in an insulated-gate layer 18 extending on the channel region surface of the P-well region and the surface of the substrate 10.

The drain region 14 in of the P-channel MOSFET is comprised of the combination of a high concentration impurity diffused region 21 (P+ region) and a low concentration impurity diffused region 22 (P- region) arranged about the high concentration impurity diffused region 21. Similarly, the drain region 15 in of the N-channel MOSFET is comprised of a high concentration impurity diffused region 23 (N+ region) and a low concentration impurity diffused region 24 (N- region) arranged about the high concentration region 23.

Denoted by reference numeral 19 is a metal layer of e.g. aluminum which is arranged above the drain region 14 of the P-channel MOSFET and the drain region 15 of the N-channel MOSFET and extends directly on an insulation layer 20 covering the substrate 10. The aluminum lead 19 above the drain region 14 of the P-channel MOSFET is directly connected to the high concentration impurity diffused region 21 (P+ region) of the P-channel MOSFET drain region 14. Also, the aluminum lead 19 above the drain region 15 of the N-channel MOSFET is directly connected to the high concentration impurity diffused region 23 (N+ region) of the N-channel MOSFET drain region 15.

In common, the aluminum lead line 19 in a CMOS inverter having two, N- and P-channel MOSFETs coupled to each other is integrally formed above the high concentration impurity diffused region (P+ and N+ regions) of a drain region of the CMOSFET. According to the embodiment, a portion of the aluminum lead line 19 is arranged to extend above the low concentration impurity diffused regions 22 and 24 (P- and N- regions allocated in a drain region between the P- and N-channel MOSFETs. More specifically, the aluminum lead line 19 of the embodiment is provided for covering the entire drain region of the CMOSFET and its portion extending above the low concentration impurity diffused regions 22 and 24 is electrically coupled to both drain regions 14 and 15.

The size of the aluminum lead line 19 may be the same as of the low concentration impurity diffused region so that the low concentration impurity diffused regions 22 and 24 of the drain regions 14 and 15 can be covered with the aluminum lead 19 in a finished integrated circuit. In the embodiment, the aluminum lead line 19 is arranged to be a size larger (1 to 2 μm more) than the low concentration impurity diffused region in view of the involvement of masking failure during water production, etching error, or excess of low concentration diffusion.

It is assumed that a low potential is applied to the gate electrode 17 of the CMOS inverter and the N- and P-channel MOSFETs are turned to OFF and ON states, respectively. At that time, a high potential of the supply voltage is fed to the source region 13 of the P-channel MOSFET and the N-type substrate 10 and a low potential is fed to the source region 16 of the N-channel MOSFET and the P-well region 11 so that there is a potential difference between the drain region 15 of the N-channel MOSFET and the P-well region 11. More particularly, a reverse bias mode appears between the drain region 15 and the P-well region 11. Also, the aluminum lead line 19 above the drain region remains at high potential (denoted by ⊕) as well as the drain diffused region of the N-channel MOSFET.

FIG. 12 is an enlarged view showing the cross section of a junction area between the P-well region 11 and the drain 15 of the N-channel MOSFET of FIG. 11.

In the CMOS inverter of the embodiment, the aluminum lead line 19 arranged above the low concentration impurity diffused region of the drain region of the MOSFET carries non of a none-directional potential and thus, the sustaining voltage of the drain junction in the MOSFET will hardly be varied by the electric field of the aluminum lead line 19. In other words, the drain junction sustaining voltage does not depend on the size or shape of the aluminum lead line 19 arranged above the low concentration impurity diffused region of the drain region so that the operating voltage of the MOSFET can be maintained at a high level. Also, the aluminum lead line 19 above the drain region serves as a drain wiring which is utilized for covering the low concentration impurity diffused region of the drain region and can be assigned as a pattern forming reference.

This effect cannot be obtained with the use of an aluminum line (e.g. a supply line) disconnected to the drain because a response action to the change of the drain potential caused by the action of the MOSFET is not pursued.

According to the embodiment, the aluminum lead line 19 is arranged to cover the entire drain region; both the high and low concentration impurity regions 21 and 22 in the P-channel MOSFET side and both the high and low concentration impurity diffused region 23 and 24 in the N-channel MOSFET side. It would be understood that the arrangement of the aluminum lead line is not limited to that of the embodiment. For achievement of the purpose, a metal layer may be arranged above the low concentration impurity diffused region, which is equal to the potential to the metal layer, of a drain region situated at one side of the PN junction which is not broken down in the reverse bias state.

Accordingly, if the sustaining voltage of the junction between the P-well region 11 and the far side portion from the gate electrode 17 of the low concentration impurity diffused region 24 of the drain region 15 in the N-channel MOSFET side is sufficiently high, the aluminum lead line 19 may be arranged to cover a surface above the adjacent side portion to the gate electrode 17 of the low concentration impurity diffused region of the drain region 15 of the N-channel MOSFET and also, to communicate electrically with the drain 15, as illustrated in FIG. 13, showing another embodiment of the present invention.

Figure 14:
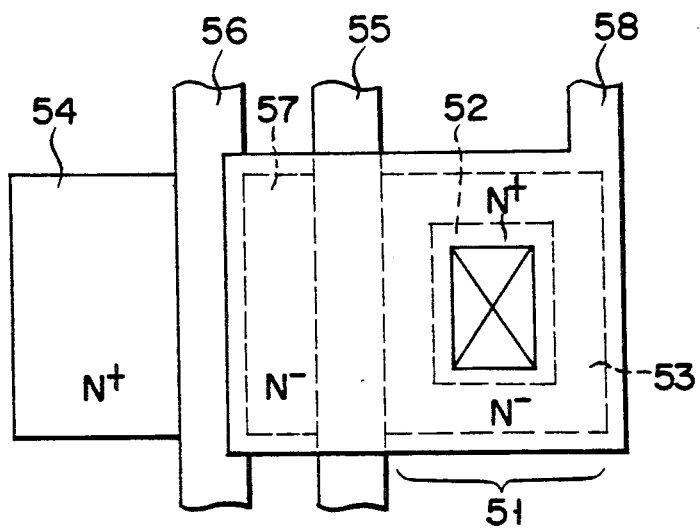
FIG. 14 is a plan view of the primary pattern of an integrated circuit according to a third embodiment of the present invention.

Another logic circuit device, similar to the CMOS inverter, employs a serial gate circuit in which a plurality of P- or N-channel MOSFETs are connected in series. For example, FIG. 14 is a plan view of one pattern arrangement illustrating a third embodiment of the present invention, in which a couple of gate electrodes 55 and 56 are arranged in parallel above an area between a drain region 51 and a source region 54. The drain region 51 incorporates the LDD arrangement comprising a high concentration impurity diffused region 52 at the N-channel side and a low concentration impurity diffused region 53 arranged about the high concentration region 51 while the source region 54 mainly comprises a high concentration impurity diffused region.

In this embodiment, the entire drain region 51 and a low concentration impurity diffused region 57 interposed between the two gate electrodes 55 and 56 are fully covered with an aluminum lead 58 which is in turn connected to the high concentration impurity diffused region 52 (N+ region) of the drain region 51.

In a common CMOSFET, the MOSFET provided in the well region is lower in the drain junction sustaining voltage than the other MOSFET provided in the substrate. For improvement, if the drain junction sustaining voltage of the MOSFET arranged in the substrate is high enough to surpass the specification requirement, only the MOSFET in the P-well region, which is identical to the N-channel MOSFET shown in FIG. 10, may be covered with a lead line coupled to the drain region.

Figure 15:
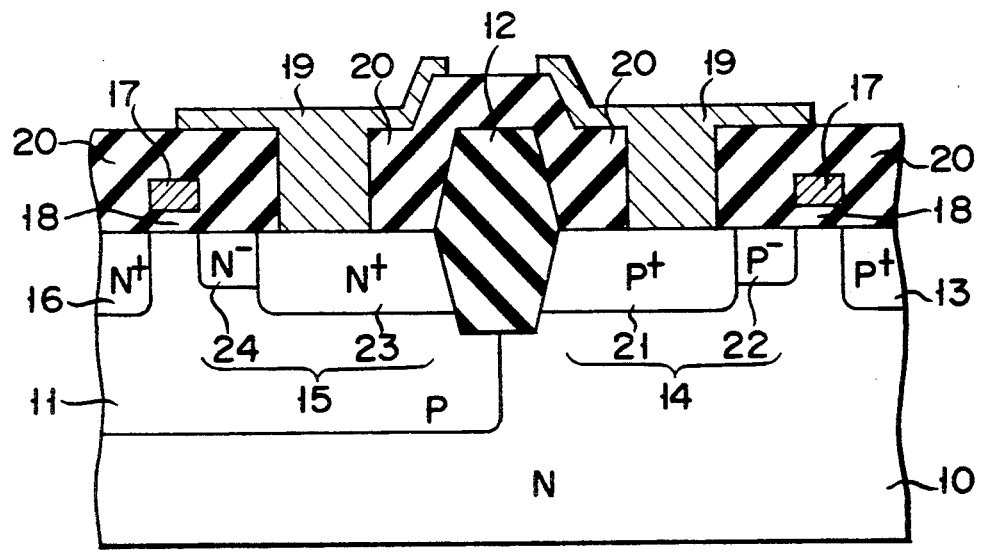
FIG. 15 is a plan view of the primary pattern of an integrated circuit according to a fourth embodiment of the present invention.

FIG. 15 illustrates a fourth embodiment of the present invention, similar to FIG. 7, in which the drain regions 14 and 15 of the P- and N-channel MOSFETS are arranged with their respective high concentration impurity diffused regions 21 and 23 not surrounded with but disposed next to the low concentration impurity diffused regions 22 and 24 respectively.

In this embodiment, an area above the low concentration impurity diffused regions 22 and 24 adjacent to the gate electrode 17 is also covered with an aluminum lead line 19 which is maintained at the same potential as of the drain region. Hence, the drain junction sustaining voltage of the MOSFET will not be attenuated by the electric field of the aluminum lead line 19.

The sustaining voltage of an integrated circuit is determined by the lowest sustaining voltage of any semiconductor pellet. Thus, all of the MOSFETs in the integrated circuit which are operated by a higher voltage or required for generation of a high voltage output are fabricated in the foregoing manner.

Preferably, either the P- or N-channel MOSFET, whichever is operated by a higher voltage or required for generation of a higher voltage output, needs to be formed to the arrangement of any embodiment described above.

Although the principles of the present invention are described with reference to the CMOS integrated circuit throughout the embodiments, they will be eligible with equal success in any P- or N-type MOS integrated circuit of which MOSFETs all are arranged in the foregoing manner for operation at a higher voltage and for generation of a high voltage output.

In the MOS integrated circuit which is operable at a higher voltage or required for providing a high voltage output, not all the regions of each semiconductor pellet are needed for operation at a higher voltage or production of a high voltage output, but only some regions. For example, FIG. 16 is a block diagram showing a semiconductor pellet arranged, according to the present invention, for use in an integrated circuit for liquid crystal display drive. While both a low voltage logic circuit 61 and a shift register 62, operable at a lower voltage are arranged in a conventional manner, the other three components—a level shifter 63 for converting the output of the shift register 62 to a high voltage, a high voltage logic circuit 64 for reception of the output of the level shifter 63, and an output buffer 65 for activating an external circuit according to an output signal from the high voltage logic circuit 64—to which a supply voltage of 5 to −40 volts is applied, are provided with MOSFETs having at corresponding regions their respective arrangements of the present invention.

As set forth above the insulated-gate type integrated circuit of the present invention is arranged in which the drain junction sustaining voltage of each MOSFET is almost free from the pattern of aluminum lead line provided above a low concentration impurity diffused region of the drain region and thus, the operating voltage of the MOSFET can remain at a high level.

Also, according to the present invention, the variation with mode of a drain junction sustaining voltage in a semiconductor pellet is eliminated and the peripheral conditions about the drain of each MOSFET are maintained constant, whereby the drain junction sustaining voltage in the pellet will be kept uniform and its assessment in each integrated circuit will be facilitated.

What is claimed is:

1. An insulated-gate type integrated circuit comprising:
   a gate electrode;
   a drain region, consisting of a low concentration impurity diffused region, provided at a side adjacent to said gate electrode, and a high concentration impurity diffused region provided next to said low concentration impurity diffused region; and
   a conductive layer connected to the high concentration impurity diffused region of said drain region and extending above said drain region to cover an entire surface of said low concentration impurity diffused region of said drain region.

2. An insulated-gate type integrated circuit according to claim 1, wherein a voltage higher than a common supply voltage is applied to said drain region.

3. An insulated-gate type integrated circuit according to claim 1, wherein both of said low and high concentration impurity diffused regions of said drain region are N-type.

4. An insulated-gate type integrated circuit according to claim 3, wherein both of said low and high concentration impurity diffused regions of said drain region are arranged within a P-type well region.

5. An insulated-gate type integrated circuit comprising:
   a first semiconductor region of a first conductivity type;
   a drain region arranged a surface area of said first semiconductor region and consisting of a low concentration impurity diffused region and a high concentration impurity diffused region, both being a second conductivity type and being adjoined to each other;
   a source region arranged on the surface area of said first semiconductor region a distance from said drain region and consisting of at least a high concentration impurity diffused region of the second conductivity type;
   a gate electrode arranged on the surface area of said first semiconductor region between said source region and said low concentration impurity diffused region of said drain region;
   an insulating layer arranged to cover the integrated circuit including said gate electrode; and
   a conductive layer electrically connected to the high concentration impurity diffused region of said drain region through an aperture in said insulating layer and extending on said insulating layer to cover an entirety of said low concentration impurity diffused region of said drain region.

6. An insulated-gate type integrated circuit according to claim 5, wherein a voltage higher than a common supply voltage is applied to said drain region.

7. An insulated-gate type integrated circuit according to claim 5, wherein both of said low and high concentration impurity diffused regions of said drain region are N-type.

8. An insulated-gate type integrated circuit according to claim 5, wherein said first semiconductor region is a well region arranged in a semiconductor substrate of said second conductivity type.

9. An insulated-gate type integrated circuit for activating a liquid crystal display comprising:
- a level shifter for level shifting an input signal;
- a high voltage logic circuit for reception of an output signal from said level shifter; and
- an output buffer for reception of an output signal from said high voltage logic circuit, said level shifter, said high voltage logic circuit, and said output buffer incorporating insulated-gate type transistors, respectively, each of the transistors comprising:
- a first semiconductor region of a first conductivity type with a surface area;
- a drain region arranged on the surface area of said first semiconductor region and consisting of a low concentration impurity diffused region and a high concentration impurity diffused region, both being formed of a second conductivity type and being adjoined to each other;
- a source region arranged on the surface area of said first semiconductor region a distance from said drain region and consisting of at least a high concentration impurity diffused region of a second conductivity type;
- a gate electrode arranged on the surface area of said first semiconductor region between said source region and said low concentration impurity diffused region of said drain region;
- an insulating layer arranged to cover the integrated circuit including said gate electrode; and
- a conductive layer electrically connected to the high concentration impurity diffused region of said drain region through an aperture in said insulating layer and extending on said insulating layer to cover an entirety of the low concentration impurity diffused region of the drain region.

10. An insulated-gate type integrated circuit comprising:
- a first semiconductor region of a first conductivity type with a surface area;
- a drain region arranged on the surface area of said first semiconductor region and consisting of a high concentration impurity diffused region of a second conductivity type and a low concentration impurity diffused region of said second conductivity type provided around said high concentration impurity diffused region;
- a source region arranged on the surface area of said first semiconductor region a distance form the drain region, consisting of at least a high concentration impurity diffused region of the second conductivity type;
- a gate electrode arranged on the surface area of said first semiconductor region between said source region and the low concentrating impurity diffused region of said drain region;
- an insulating layer arranged to cover the integrated circuit including said gate electrode; and
- a conductive layer electrically connected to the high concentration impurity diffused region of said drain region through apertures in said insulating layer and extending on said insulating layer to cover an entirety of said low concentration impurity diffused region of said drain region.

11. An insulated-gate type integrated circuit according to claim 10, wherein a voltage higher than a common supply voltage is applied to said drain region.

12. An insulated-gate type integrated circuit according to claim 10, wherein both of said low and high concentration impurity diffused regions of said drain region are N-type.

13. An insulated-gate type integrated circuit according to claim 10, wherein said first semiconductor region is a well region arranged in said semiconductor substrate of said second conductivity type.

14. An insulated-gate type integrated circuit for activating a liquid crystal display comprising:
- a level shifter for level shifting an input signal;
- a high voltage logic circuit for reception of an output signal from said level shifter; and
- an output buffer for reception of an output signal from said high voltage logic circuit, said level shifter, said high voltage logic circuit, and said output buffer incorporating insulated-gate type transistors, respectively, each of the transistors comprising:
- a first semiconductor region of a first conductivity type with a surface area;
- a drain region arranged on the surface area of said first semiconductor region and consisting of a high concentration impurity diffused region of a second conductivity type and a low concentration impurity diffused region of said second conductivity type provided around said high concentration impurity diffused region;
- a source region arranged on the surface area of said first semiconductor region a distance from said drain region, consisting of at least a high concentration impurity diffused region of said second conductivity type;
- a gate electrode arranged on the surface area of said first semiconductor region between said source region and said low concentration impurity diffused region of said drain region;
- an insulating layer arranged to cover the integrated circuit including said gate electrode; and
- a conductive layer electrically connected to the high concentration impurity diffused region of said drain region through apertures in said insulating layer and extending on said insulating layer to cover an entirety of said low concentration impurity diffused region of said drain region.

* * * * *